(12) United States Patent
Schneider et al.

(10) Patent No.: US 12,000,889 B2
(45) Date of Patent: Jun. 4, 2024

(54) SIGNAL GENERATION DEVICE, MEASUREMENT DEVICE, AND METHOD

(71) Applicant: Rohde & Schwarz GmbH & Co. KG, Munich (DE)

(72) Inventors: Benjamin Schneider, Chemnitz (DE); Mario Guenther, Glauchau (DE)

(73) Assignee: ROHDE & SCHWARZ GMBH CO. KG, Munich (DE)

(*) Notice: Subject to any disclaimer, the term of this patent is extended or adjusted under 35 U.S.C. 154(b) by 148 days.

(21) Appl. No.: 17/857,260

(22) Filed: Jul. 5, 2022

(65) Prior Publication Data

US 2024/0012049 A1  Jan. 11, 2024

(51) Int. Cl.
*G01R 31/317* (2006.01)
(52) U.S. Cl.
CPC .................. *G01R 31/31727* (2013.01)
(58) Field of Classification Search
CPC .................................................. G01R 31/31727
See application file for complete search history.

(56) References Cited

U.S. PATENT DOCUMENTS

| 8,483,341 | B2* | 7/2013 | Miki | G06F 1/0321 375/360 |
|---|---|---|---|---|
| 2010/0164577 | A1* | 7/2010 | Kim | G11C 7/22 327/161 |
| 2017/0230039 | A1* | 8/2017 | Park | H03K 5/1506 |
| 2020/0284832 | A1 | 9/2020 | Barthel | |

* cited by examiner

*Primary Examiner* — Giovanni Astacio-Oquendo
*Assistant Examiner* — Zannatul Ferdous
(74) *Attorney, Agent, or Firm* — Patterson + Sheridan, LLP

(57) ABSTRACT

The present disclosure provides a signal generation device, comprising at least two signal generators, a clock source that is coupled to the at least two signal generators and that is configured to generate a clock signal and provide the clock signal to the at least two signal generators, wherein the signal paths between the clock source and each one of the at least two signal generators are matched at least regarding the signal runtime, and wherein the at least two signal generators are each configured to generate an output signal based on the clock signal. Further, the present disclosure provides a respective measurement device and a respective method.

16 Claims, 6 Drawing Sheets

SIGNAL GENERATION DEVICE, MEASUREMENT DEVICE, AND METHOD

TECHNICAL FIELD

The disclosure relates to a signal generation device, a respective measurement device and a respective method.

BACKGROUND

Although applicable to any measurement application, the present disclosure will mainly be described in conjunction with signal generators for measurement systems.

Signal generators are used in measurement applications for example, to provide a device under test, DUT, with respective test or excitation signals. Measurement devices may be used to measure the output of the DUT that the DUT generates based on the test or excitation signals.

In complex measurement applications, more than a single signal generator may be needed.

Accordingly, there is a need for providing synchronized signal generators.

SUMMARY

The above stated problem is solved by the features of the independent claims. It is understood, that independent claims of a claim category may be formed in analogy to the dependent claims of another claim category.

Accordingly, it is provided:

A signal generation device, comprising at least two signal generators, and a clock source that is coupled to the at least two signal generators and that is configured to generate a clock signal and provide the clock signal to the at least two signal generators, wherein the signal paths between the clock source and each one of the at least two signal generators are matched at least regarding the signal runtime, and wherein the at least two signal generators are each configured to generate an output signal based at least on the clock signal.

Further, it is provided:

A measurement device, comprising a signal generation device, the signal generation device comprising, at least two signal generators, a clock source that is coupled to the at least two signal generators and that is configured to generate a clock signal and provide the clock signal to the at least two signal generators, wherein the signal paths between the clock source and each one of the at least two signal generators are matched at least regarding the signal runtime, and wherein the at least two signal generators are each configured to generate an output signal for a device under test based at least on the clock signal, and comprising at least one signal measurement input configured to measure a signal generated by the device under test based on the output signals provided to the device under test.

In addition, it is provided:

A method for operating a signal generation device, wherein the signal generation device comprises at least two signal generators, and a clock source that is coupled to the at least two signal generators, the method comprising generating with the clock source a clock signal, providing the clock signal to the at least two signal generators via signal paths between the clock source and each one of the at least two signal generators that are matched at least regarding the signal runtime, and generating and outputting an output signal based on the clock signal with each one of the at least two signal generators.

The present disclosure is based on the finding that in modern measurement applications multiple synchronized signal generators may be desired. For example, if a device under test, DUT, has two input ports of a differential input, two respectively synchronized signals are to be provided to the DUT to perform respective measurements. Of course, on the output of the DUT a single output port may be provided and a measurement device may measure the output at the single output port. As alternative, such a DUT may also provide a differential output with two output ports that may be coupled to a measurement device.

For providing a DUT with multiple input ports with a respective test or excitation signal, multiple signal generators are provided. However, synchronizing multiple dedicated signal generators is a cumbersome and complex task. Each one of such dedicated signal generators can comprise an internal clock source and a respective signal generation unit.

Two clock sources, even if they have the same specification, will never be exactly synchronized for example, for reasons of production variances between the units. Even if a common external clock source is provided to multiple signal generators, the signal generators may still not output fully synchronized signals. For example, the signal runtime of the clock signal from the external clock source to the single signal generators may be different for each one of the signal generators, or the single signal generators may have different temperatures and components within the signal generators may have different temperature drifts, or different internal signal runtimes.

The present invention, therefore, provides the signal generation device with at least two signal generators. The at least two signal generators are provided internal in the signal generation device. Further, a clock source is provided in the signal generation device. The clock source is coupled to all of the at least two signal generators and provides the same clock signal to all of the at least two signal generators.

In addition, in the signal generation device the signal paths between the at least two signal generators and the clock source are matched at least regarding the signal runtime. That means that a pulse of the clock signal will reach each one of the at least two signal generators essentially at the exact same time. Matched signal paths may for example, be provided by adapting the length of signal lines or traces to be equal, or by providing (configurable) delay elements.

Consequently, each one of the at least two signal generators will be clocked according to an exact, common clock signal and will provide an output signal based on this exact, common clock signal. The time synchronization of the at least two signal generators is, because of the matched signal paths, inherently provided by the signal generation device without the need to provide any additional external synchronization or any other means of clock synchronization in the at least two signal generators.

In addition, since the at least two signal generators are provided in the same signal generation device, effects, like temperature drifts and other external interference sources, are minimized or at least happen in parallel in all of the at least two signal generators.

It is understood, that the signal generation device may be used as a stand-alone device to provide highly synchronized output signals.

However, in embodiments, the signal generation device may be provided as a component of a measurement device, for example an oscilloscope, a vector network analyzer, or a frequency response analysis measurement device.

By providing the signal generation device in such a measurement device, it is not only possible to provide highly synchronized measurement signals to a DUT. In addition, it is also possible to measure or record the output signal of the DUT in response to the output signals of the signal generation device being provided to an input of the DUT.

It is understood, that the measurement device may be provided with any embodiment of the signal generation device as explained in the present disclosure.

In a measurement system or application according to the present disclosure, a measurement device according to the present disclosure may be coupled via at least two signal outputs to a DUT in order to provide the output signals of the signal generators to the DUT. At least one measurement input of the measurement device may be coupled to an output of the DUT to acquire signals provided by the DUT in the measurement device.

With the subject of the present disclosure, it is therefore easily possible to provide multiple test or excitation signals for a DUT that are well synchronized.

Further embodiments of the present disclosure are subject of the further dependent claims and of the following description, referring to the drawings.

In an embodiment, the signal generation device may further comprise a first signal measurement sensor for each one of the at least two signal generators, and a first signal comparator that is coupled on the input side to each one of the first signal measurement sensors and on the output side to at least all of the at least two signal generators but one of the at least two signal generators, wherein each one of the first signal measurement sensors is configured to measure the output signal of the respective one of the at least two signal generators, and wherein the first signal comparator is configured to compare the amplitudes of the output signals and provide a respective amplitude correction factor to each one of the at least two signal generators to which the first signal comparator is coupled to, and wherein each one of the at least two signal generators to which the first signal comparator is coupled to comprises an amplitude controller configured to control the amplitude of the respective output signal based on the amplitude correction factor.

The first signal measurement sensors may in embodiments each comprise a voltage sensor that measures the voltage level of the respective output signal. The amplitude of the output signal may in such embodiments be seen as a maximum voltage level of the respective output signal for example, during a single period or multiple periods of the output signal.

It is understood, that the first signal measurement sensors may also measure other units. If for example, the output signals are current-based output signals, the at least two signal generators may also comprise current sensors and measure the current level of the respective output signal. The amplitude of the output signal may in such embodiments be seen as a maximum current level of the respective output signal for example, during a single period or multiple periods of the output signal.

The first signal comparator receives the output of the first signal measurement sensors, for example a signal indicating the voltage or current level of the respective output signal. It is understood, that the first signal comparator may receive a continuous stream of measurement data and may determine the amplitude based on the stream of measurement data. As alternative, the first signal measurement sensors may determine the amplitude and provide the first signal comparator with an indication of the amplitude of the respective output signals.

The first signal comparator determines an amplitude correction factor based on the amplitudes of the single output signals. The amplitude correction factor may indicate a multiplier that is to be applied to the respective output signals in the at least two signal generators.

For example, the amplitude may be set to be 5V in a measurement application. If the amplitude of an output signal is only 4V, the amplitude correction factor for that output signal may be 5V/4V=1.25.

In embodiments, one of the signal generators may be seen as the reference signal generator. In such embodiments, the first signal comparator may provide the amplitude correction factor only to the signal generators that are not the reference signal generator. Further, in such embodiments, the amplitude of the output signal of the reference signal generator may be used as the reference for calculating the amplitude correction factor for the output signals of all other signal generators.

Of course, in other embodiments, the first signal comparator may calculate an amplitude correction factor for all of the signal generators. In such embodiments, the reference amplitude e.g., the reference voltage or reference current, may be set or stored in the first signal comparator, or the first signal comparator may comprise a reference source e.g., a reference voltage or current source.

In another embodiment, the signal generation device may further comprise a second signal measurement sensor for each one of the at least two signal generators, and a second signal comparator that is coupled on the input side to each one of the second signal measurement sensors and on the output side to at least all of the at least two signal generators but one of the at least two signal generators, wherein each one of the second signal measurement sensors is configured to measure the output signal of the respective one of the at least two signal generators, and wherein the second signal comparator is configured to compare the phases of the output signals and provide a respective phase correction factor to each one of the at least two signal generators to which the second signal comparator is coupled to, wherein each one of the at least two signal generators to which the second signal comparator is coupled to comprises a phase controller configured to control the phase of the respective output signal based on the phase correction factor.

The second signal measurement sensors may in embodiments each comprise a voltage sensor that measures the voltage level of the respective output signal. The phase of the output signal may in such embodiments be seen as the point in time of the voltage level of the respective output signal being zero with respect to a reference point in time.

It is understood, that the second signal measurement sensors may also measure other units. If for example, the output signals are current-based output signals, the at least two signal generators may also comprise current sensors and measure the current level of the respective output signal. The phase of the output signal may in such embodiments be seen as the point in time of the current level of the respective output signal being zero with respect to the reference point in time.

The second signal comparator receives the output of the second signal measurement sensors, for example a signal indicating the voltage or current level of the respective output signal. It is understood, that the second signal comparator may receive a continuous stream of measurement data and may determine the phase based on the stream of measurement data. As alternative, the second signal measurement sensors may determine the phase for each one of the output signals and may provide the second signal comparator with an indication of the phases of the respective output signals.

The second signal comparator determines a phase correction factor based on the phases of the single output signals. The phase correction factor may indicate an offset that is to be applied to the respective output signal in the time dimension or on the time axis in the at least two signal generators.

In one embodiment, the phase offset between the single signal generators is zero when outputting a synchronized continuous signal, like a sine signal, for example, in a calibration mode.

In embodiments, one of the signal generators may be seen as the reference signal generator. In such embodiments, the second signal comparator may provide the phase correction factor only to the signal generators that are not the reference signal generator. Further, in such embodiments, the phase of the output signal of the reference signal generator e.g., the point in time of the zero crossing of the respective output signal, may be used as the reference for calculating the phase correction factor for the output signals of all other signal generators.

Of course, in other embodiments, the second signal comparator may calculate a phase correction factor for all of the signal generators. In such embodiments, the reference phase or point in time may be set or stored in the second signal comparator, or the second signal comparator may comprise a reference time source.

The second signal comparator may in embodiments comprise a timer for measuring the deviation between the reference phase or reference point in time and the phases or points in time of the zero crossings of the output signals.

It is noted that with the solution of the present disclosure, it is not required to provide a speed adjustment of the clock signal of the single signal generators, since a common clock source with matched signal paths is provided that feeds the same clock signal to all of the at least two signal generators.

In embodiments, the first signal measurement sensors and the second signal measurement sensors may be provided as a single sensor in each case for example, as a voltage or current sensor. In such an embodiment, the first signal comparator and the second signal comparator may also be provided as a single signal comparator that performs or is configured to perform all of the above-presented functions of the first signal comparator and the second signal comparator. The signal comparator may be configurable, and may for example be configured to use an internal reference or to use one of the received measured output signals as reference.

In a further embodiment of the signal generation device, the at least two signal generators may each comprise an arbitrary signal generator with a signal memory, wherein the arbitrary signal generator may be configured to output an arbitrary signal based on signal data that is stored in the signal memory.

Arbitrary signal generators may also be called arbitrary waveform generators. Arbitrary signal generators may be used to generate any arbitrary waveform as output signal. To this end, an arbitrary signal generator comprises a signal memory that stores signal data for the signal to be generated. The signal data may comprise single points on the waveform to be generated, or "waypoints" of the signal to be generated. While generating the output signal, the arbitrary signal generator may jump from one point or "waypoint" to the next or may interpolate the signal between the points or "waypoints".

It is understood, that in order to determine the amplitude correction factor and the phase correction factor, the signal generation device may be put in a calibration mode for example, by a user or automatically in certain time intervals. In the calibration mode, the arbitrary signal generators may be configured to output a respective calibration output signal for example, a sine wave signal, which allows easily determining the amplitude offset and the phase offset.

As indicated above, the calibration mode may be actively triggered by a user. As alternative, the calibration mode may also be initiated by the signal generation device in predetermined intervals or in specific situations. The predetermined interval may for example be specified by the manufacturer of the signal generation device. Specific situations may comprise any situation of the signal generation device, in which the at least two signal generators, the first and second signal measurement sensors and the first and second signal comparators are not required for performing a measurement. Such a specific situation may also be the start-up or shut-down of the signal generation device.

In the calibration mode, the output ports of the signal generation device may be deactivated for example, by respective switches.

In yet another embodiment of the signal generation device, the at least two signal generators may each comprise a sine signal generator that may be configured to output a sine signal with a predetermined frequency and amplitude.

In measurement applications that require a frequency response analysis, sine signal generators can be used to provide a single output signal to a DUT.

With the features of the present disclosure, it is now possible to provide multiple synchronized sine signals as output signals to a DUT or multiple DUTs, without requiring a complex external synchronization of external signal generators.

Of course, the sine signal generators may be configured to provide differential output signals. For example, two sine signal generators may be configured to each provide a sine signal, wherein a respective phase offset of phase shift may be provided between the two sine signals.

In another embodiment of the signal generation device, the at least two signal generators may each comprise at least one of an attenuation/amplification unit, and a phase shifter.

The attenuation/amplification unit may for example comprise at least one of a configurable attenuator for attenuating the output signal, and an amplifier for amplifying the output signal. It is understood, that the amplitude correction factor may be used as the setting for the attenuator or the amplifier, or that the setting may at least be determined based on the amplitude correction factor.

The phase shifters serve to shift the phase of the output signal according to a respective phase shift setting. It is understood, that the phase correction factor may be used as the phase shift setting, or that the phase shift setting may at least be determined based on the phase correction factor. In applications with differential output signals, the phase shift may be configured, while the phase correction factor is taken into account together with the configured phase shift.

In a further embodiment of the signal generation device, the at least two signal generators may each comprise a digital signal generation section and a digital-to-analog converter coupled to the digital signal generation section.

The digital signal generation section may be provided as a dedicated processing element, like e.g., a processing unit, a microcontroller, a field programmable gate array, FPGA, a complex programmable logic device, CPLD, or the like. The digital signal generation section may at least in part also be provided as a computer program product comprising computer readable instructions that may be executed by a processing element. In a further embodiment, the digital signal generation section may be provided as addition or additional function or method to the firmware or operating system of a processing element that is already present in the respective application as respective computer readable instructions. Such computer readable instructions may be stored in a memory that is coupled to or integrated into the processing element. The processing element may load the computer readable instructions from the memory and execute them.

In addition, it is understood, that any required supporting or additional hardware may be provided like e.g., a power supply circuitry and clock generation circuitry.

The digital signal generation section may for example, be provided at least in part in an FPGA that is configured to read waveform data from a memory and generate a respective digital output signal. The digital output signal may then be converted by the digital-to-analog converter from a digital signal into an analog output signal. The FPGA and the digital-to-analog converter are in such an embodiment both supplied with or based on the clock signal that is provided by the common clock source.

Of course, any other component of the signal generation device that may be implemented as digital circuitry may also be provided in the FPGA.

In embodiments, the digital signal generation section comprises at least one of a digital phase-shifter, and a digital attenuator or amplifier. In such an embodiment, the phase and amplitude of the output signal are not necessarily changed or adapted in the analog domain. Instead, the amplitude and the phase of the output signal are adapted in the digital domain prior to converting the output signal from a digital signal into an analog signal.

In embodiments, an analog signal processing section may be provided attached to the digital-to-analog converter to at least one of filter, attenuate, amplify and up-/down-convert the output signal prior to outputting the output signal from the signal generation device.

In yet another embodiment of the signal generation device the signal generation device may be provided as an oscilloscope, a vector network analyzer, or as a frequency response analysis device.

When provided as or in an oscilloscope or a frequency response analysis device, the components of the oscilloscope or the frequency response analysis device may be re-used for the signal generation device. For example, the measurement arrangement of the oscilloscope or frequency response analysis device may be used as the first and second signal measurement sensors and the first and second signal comparators.

The signal processing logic that is often present in modern oscilloscopes and frequency response analysis devices may be used to determine the amplitude offset and the phase offset, and to calculate the amplitude and phase correction factors.

In another embodiment of the signal generation device, the at least two signal generators may be configured to each output for example, in a measurement mode of operation, the respective output signal with at least one of a configurable phase offset, and a configurable amplitude, and a configurable amplitude offset.

The at least two signal generators may be configured to each output the same signal or same waveform. If no further settings are provided to the at least two signal generators, the at least two signal generators may output the exact same output signal.

The at least two signal generators may also be configured to each output a different signal or waveform. If no further settings are provided to the at least two signal generators, the at least two signal generators may output different output signals but with the same phase and amplitude.

In order to perform measurement on a DUT, it may be desired to output differential signals. The "term differential signal" refers to signals comprising at least one of different phases or phase offsets, and different amplitude offsets.

Therefore, in embodiments, the at least two signal generators may be parametrized or configured for example, in a measurement mode of operation, to output the respective output signal with at least one of a respective phase or phase offset, and a respective amplitude offset. The at least two signal generators may for example output the same signal, like for example a sine wave signal, but with a phase or phase offset of 180° to perform measurements on a DUT with a differential signal input.

In a further embodiment of the measurement device the at least two signal generators may be configured to output a differential signal to a device under test.

As already explained above, the at least two signal generators may generate a differential signal with a respective phase or phase offset to each other, and with a respective amplitude offset.

Such output signals may then be fed to the DUT on two input ports that form a differential input of the DUT.

In yet another embodiment, the measurement device may comprise a signal processor configured to calculate a frequency response for the device under test based on the output signals and the signal measured by the at least one signal measurement input.

The signal processor may also be configured to compare a specific one of the output signals that are provided to the DUT with a signal measured by a specific one of the signal measurement inputs. For example, a first output signal may be compared to a signal measured by a first signal measurement input, or a second output signal may be compared to a signal measured by a first signal measurement input, or a first output signal may be compared to a signal measured by a second signal measurement input, or a second output signal may be compared to a signal measured by a second signal measurement input. With more than two output signals or more than two signal measurement inputs, any other combination is also possible. Comparing may for example refer to setting the amplitudes, in the time domain or the frequency domain, of the signals into relation.

The signal processor may be provided as a dedicated processing element, like e.g., a processing unit, a microcontroller, a field programmable gate array, FPGA, a complex programmable logic device, CPLD, or the like. The signal processor may at least in part also be provided as a computer program product comprising computer readable instructions that may be executed by a processing element. In a further embodiment, the signal processor may be provided as addition or additional function or method to the firmware or operating system of a processing element that is already present in the respective application as respective computer readable instructions. Such computer readable instructions may be stored in a memory that is coupled to or integrated into the processing element. The processing element may load the computer readable instructions from the memory and execute them. In addition, it is understood, that any required supporting or additional hardware may be provided like e.g., a power supply circuitry and clock generation circuitry.

It is understood, that the measurement device may further comprise a display to display the frequency response for example, in the form of a Bode plot that may be provided by the signal processor.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
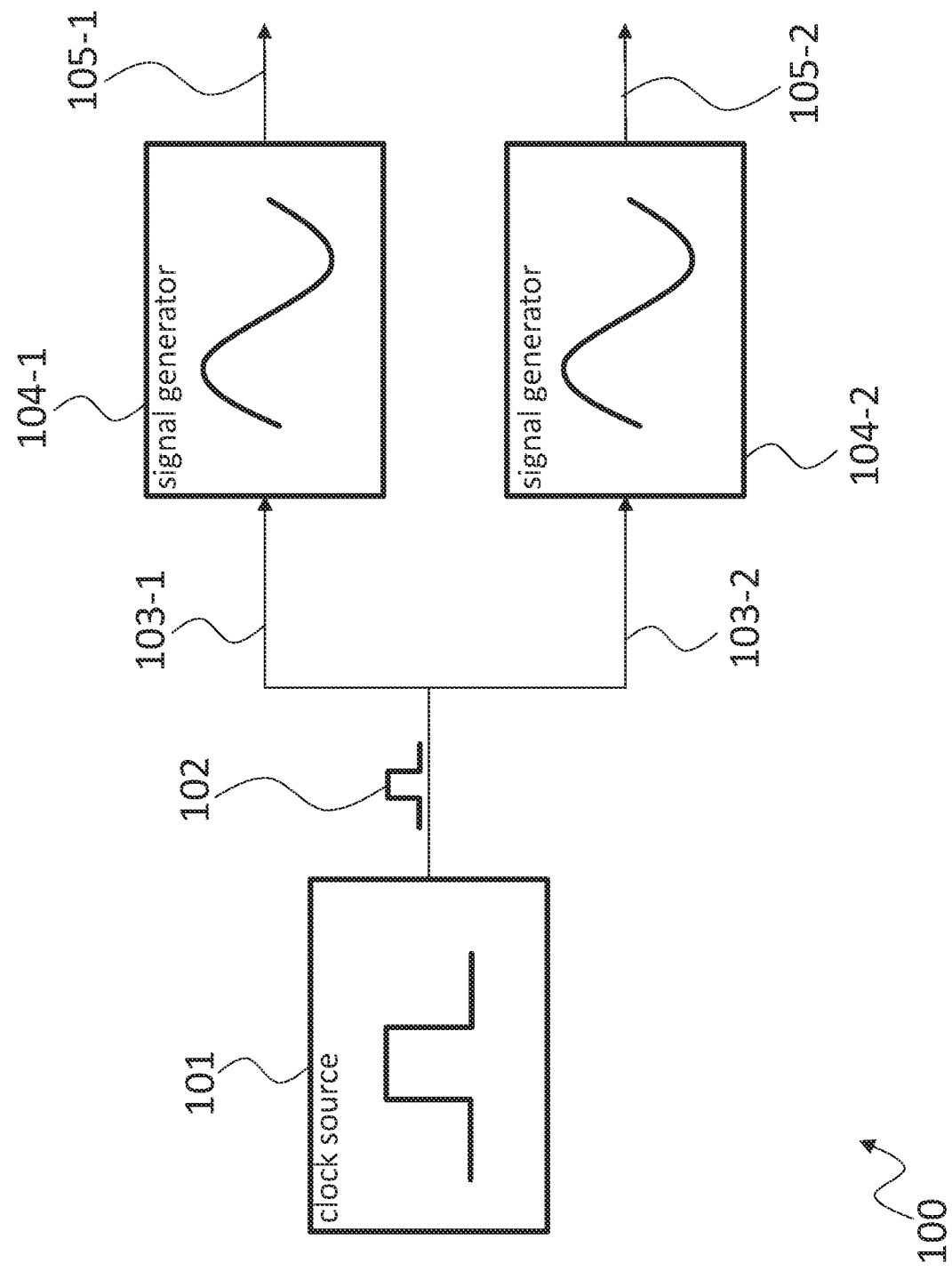
FIG. 1 shows a block diagram of an embodiment of a signal generation device according to the present disclosure.

FIG. 1 shows a block diagram of a signal generation device 100. The signal generation device 100 comprises a clock source 101 that is coupled to each of a first signal generator 104-1 and a second signal generator 104-2 via a respective signal path 103-1, 103-2. It is understood, that the number of two signal generators 104-1, 104-2 is just exemplarily chosen, and that in other embodiments, the signal generation device 100 may comprise more than two signal generators 104-1, 104-2.

The clock source generates a clock signal 102 and provides the clock signal 102 to the two signal generators 104-1, 104-2 via the two signal paths 103-1, 103-2. The signal paths 103-1, 103-2 in the signal generation device 100 are matched at least regarding the signal runtime. That means, that the clock signal 102 arrives at the signal generators 104-1, 104-2 essentially at the same time. Each one of the signal generators 104-1, 104-2 generates an output signal 105-1, 105-2 based on the clock signal. Matching the signal paths 103-1, 103-2 may be performed by adapting the length of the signal paths 103-1, 103-2, or with additional (not shown) delay elements.

In a calibration mode, the two signal generators 104-1, 104-2 may be controlled to output the same output signals 105-1, 105-2. In contrast, in a measurement mode, the two signal generators 104-1, 104-2 may be controlled to output the different output signals 105-1, 105-2, for example a sine signal with the same frequency, but with a configurable phase shift of for example, 180° degree.

Figure 2:
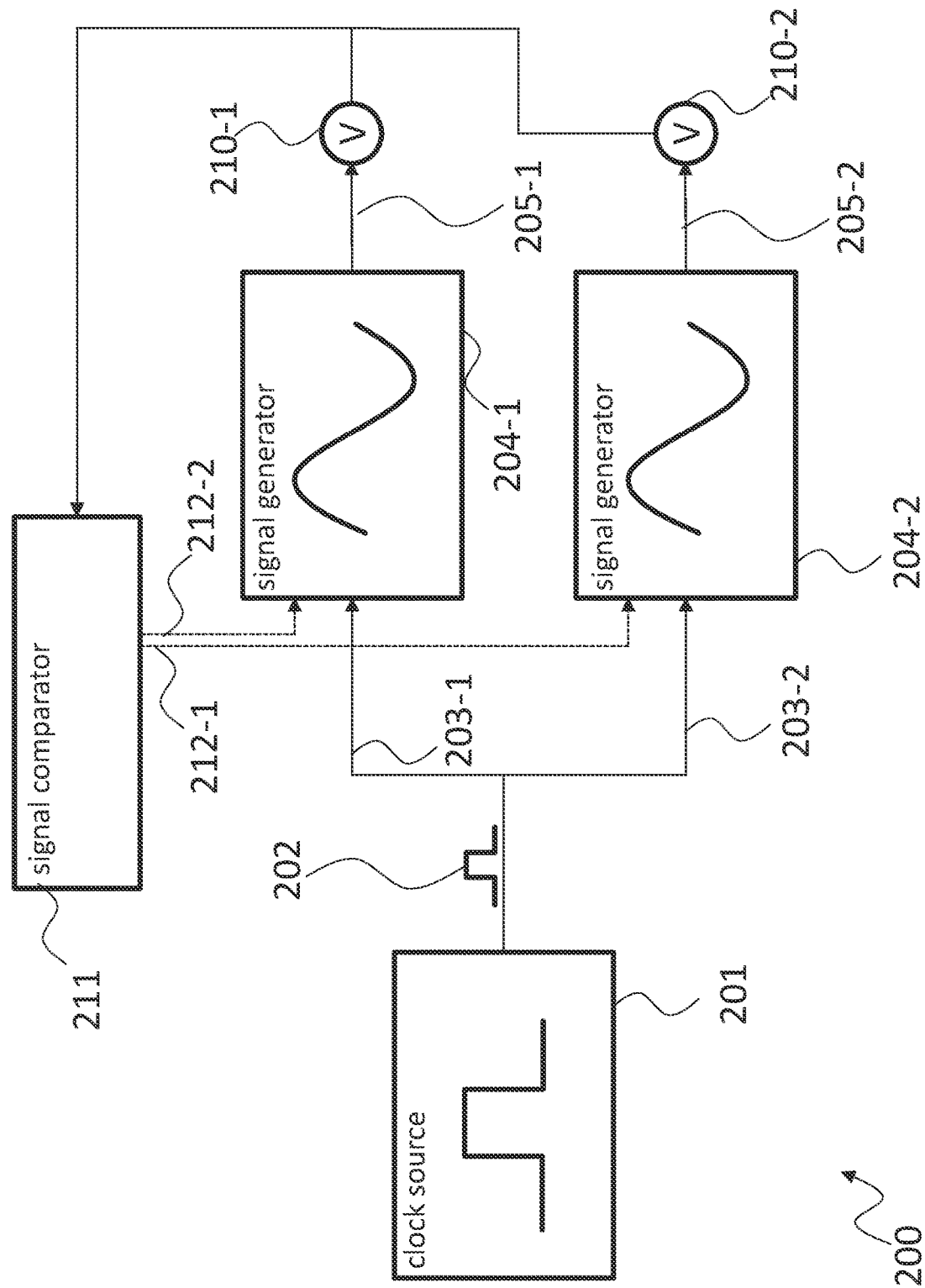
FIG. 2 shows a block diagram of another embodiment of a signal generation device according to the present disclosure.

FIG. 2 shows a block diagram of another signal generation device 200. The signal generation device 200 is based on the signal generation device 100. Therefore, the signal generation device 200 comprises a clock source 201 that is coupled to each of a first signal generator 204-1 and a second signal generator 204-2 via a respective signal path 203-1, 203-2. It is understood, that the number of two signal generators 204-1, 204-2 is just exemplarily chosen, and that in other embodiments, the signal generation device 200 may comprise more than two signal generators 204-1, 204-2. The explanations provided above regarding the signal generation device 100 also apply to the signal generation device 200.

The signal generation device 200 further comprises a signal measurement sensor 210-1, 210-2 for every one of the output signals 205-1, 205-2. The signal measurement sensors 210-1, 210-2 may for example, be provided as voltage sensors. Alternatively, the measurement sensors 210-1, 210-2 may be provided as current sensors.

The signal generation device 200 further comprises a signal comparator 211 that is coupled to the signal measurement sensors 210-1, 210-2 to evaluate the measured signals.

The signal comparator 211 may for example, determine an amplitude deviation between the two output signals 205-1, 205-2 and determine respective amplitude correction factors 212-1, 212-2, such that when applied to the output signals 205-1, 205-2, the output signals 205-1, 205-2 comprise the same amplitude. The amplitude correction factors 212-1, 212-2 may then be provided to the signal generators 204-1, 204-2 for adapting the amplitude of the output signals 205-1, 205-2.

In another embodiment, the signal comparator 211 may for example, determine a phase deviation between the two output signals 205-1, 205-2 and determine respective phase correction factors 212-1, 212-2, such that when applied to the output signals 205-1, 205-2, the output signals 205-1, 205-2 comprise the same phase. The phase correction factors 212-1, 212-2 may then be provided to the signal generators 204-1, 204-2 for adapting the phase of the output signals 205-1, 205-2.

In other embodiments, the signal comparator 211 may determine the amplitude deviation and the phase deviation between the two output signals 205-1, 205-2 and determine respective amplitude and phase correction factors 212-1, 212-2, such that when applied to the output signals 205-1, 205-2, the output signals 205-1, 205-2 comprise the same amplitude and phase. The amplitude and phase correction factors 212-1, 212-2 may then be provided to the signal generators 204-1, 204-2 for adapting the amplitude and phase of the output signals 205-1, 205-2.

In the shown embodiment, the signal comparator 211 may comprise an internal voltage reference and phase reference. In other embodiments, one of the output signals 205-1, 205-2 may serve as a reference for the signal comparator 211. In such an embodiment, only the signal generators 204-1, 204-2 that do not provide the reference output signal 205-1, 205-2 may be provided with a correction factor 212-1, 212-2.

Figure 3:
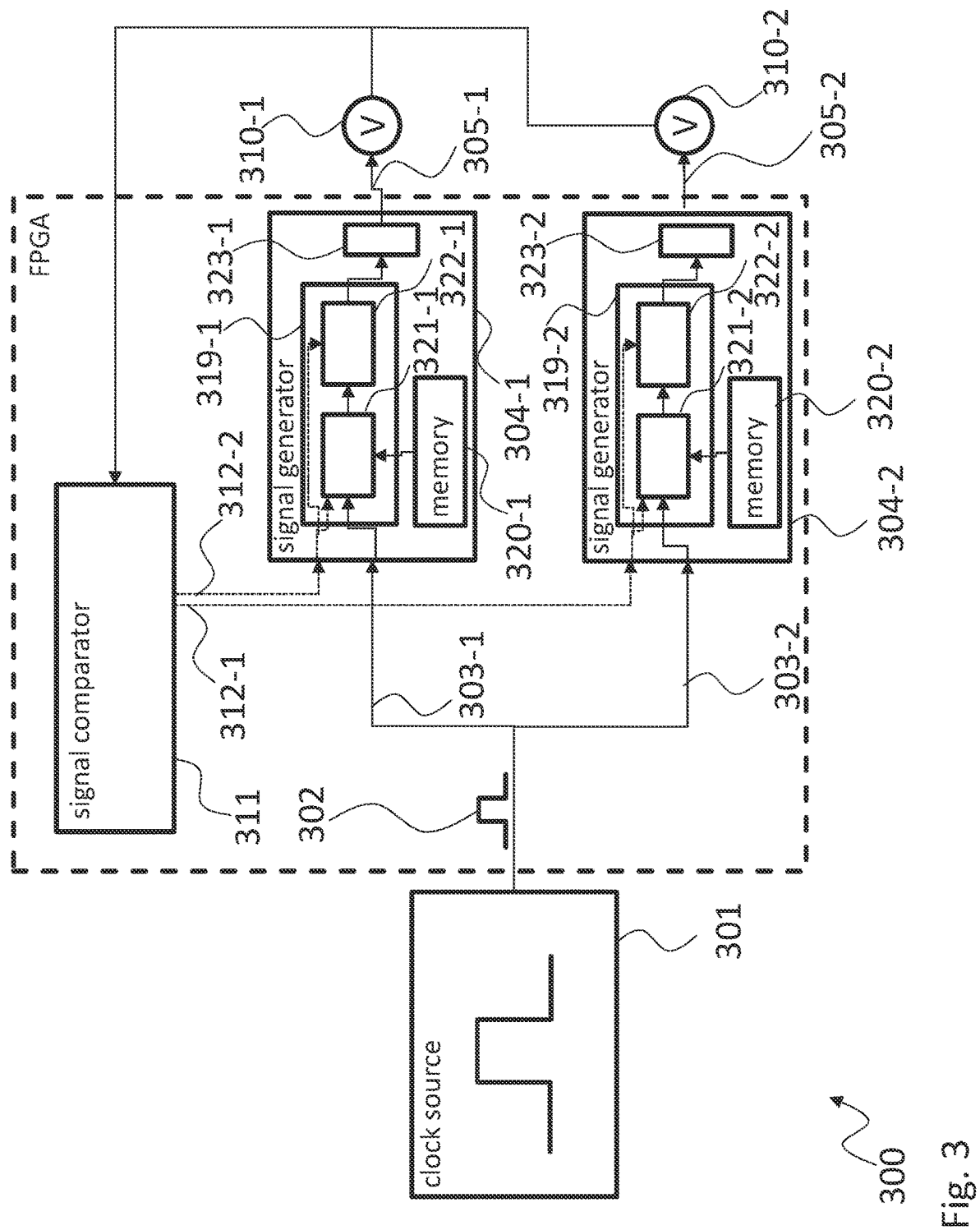
FIG. 3 shows a block diagram of another embodiment of a signal generation device according to the present disclosure.

FIG. 3 shows a block diagram of another signal generation device 300. The signal generation device 300 is based on the signal generation device 200. Therefore, the signal generation device 300 comprises a clock source 301 that is coupled to each of a first signal generator 304-1 and a second signal generator 304-2 via a respective signal path 303-1, 303-2. It is understood, that the number of two signal generators 304-1, 304-2 is just exemplarily chosen, and that in other embodiments, the signal generation device 300 may comprise more than two signal generators 304-1, 304-2. The explanations provided above regarding the signal generation device 100 also apply to the signal generation device 300. The signal generation device 300 also comprises a signal measurement sensor 310-1, 310-2 for every one of the output signals 305-1, 305-2, and a signal comparator 311 that is coupled to the signal measurement sensors 310-1, 310-2 to evaluate the measured signals. The signal measurement sensors 310-1, 310-2 may for example, be provided as voltage sensors. Alternatively, the measurement sensors 210-1, 210-2 may be provided as current sensors.

The explanations provided above regarding the signal generation device 200 also apply to the signal generation device 300.

In the signal generation device 300, the signal generators 304-1, 304-2, and the signal comparator 311 are provided as a configuration of an FPGA. In embodiments, at least part of the clock source 301 may also be provided in the FPGA.

The signal generators 304-1, 304-2 each comprise a digital signal generation section 319-1, 319-2 and a memory 320-1, 320-2. The digital signal generation sections 319-1, 319-2 read signal data from the respective memory 320-1, 320-2 and adapt the amplitude of the signal with an attenuation/amplification unit 321-1, 321-2. The digital signal generation sections 319-1, 319-2 further adapt the phase of the signal with a respective phase shifter 322-1, 322-2 and provide the respectively modified signal to a digital-to-analog converter 323-1, 323-2. The digital-to-analog converters 323-1, 323-2 provide the respective output signals 305-1, 305-2.

In embodiments, the attenuation/amplification units 321-1, 321-2 and the phase shifters 322-1, 322-2 may be provided at least in part as analog elements after the digital-to-analog converters 323-1, 323-2.

Figure 4:
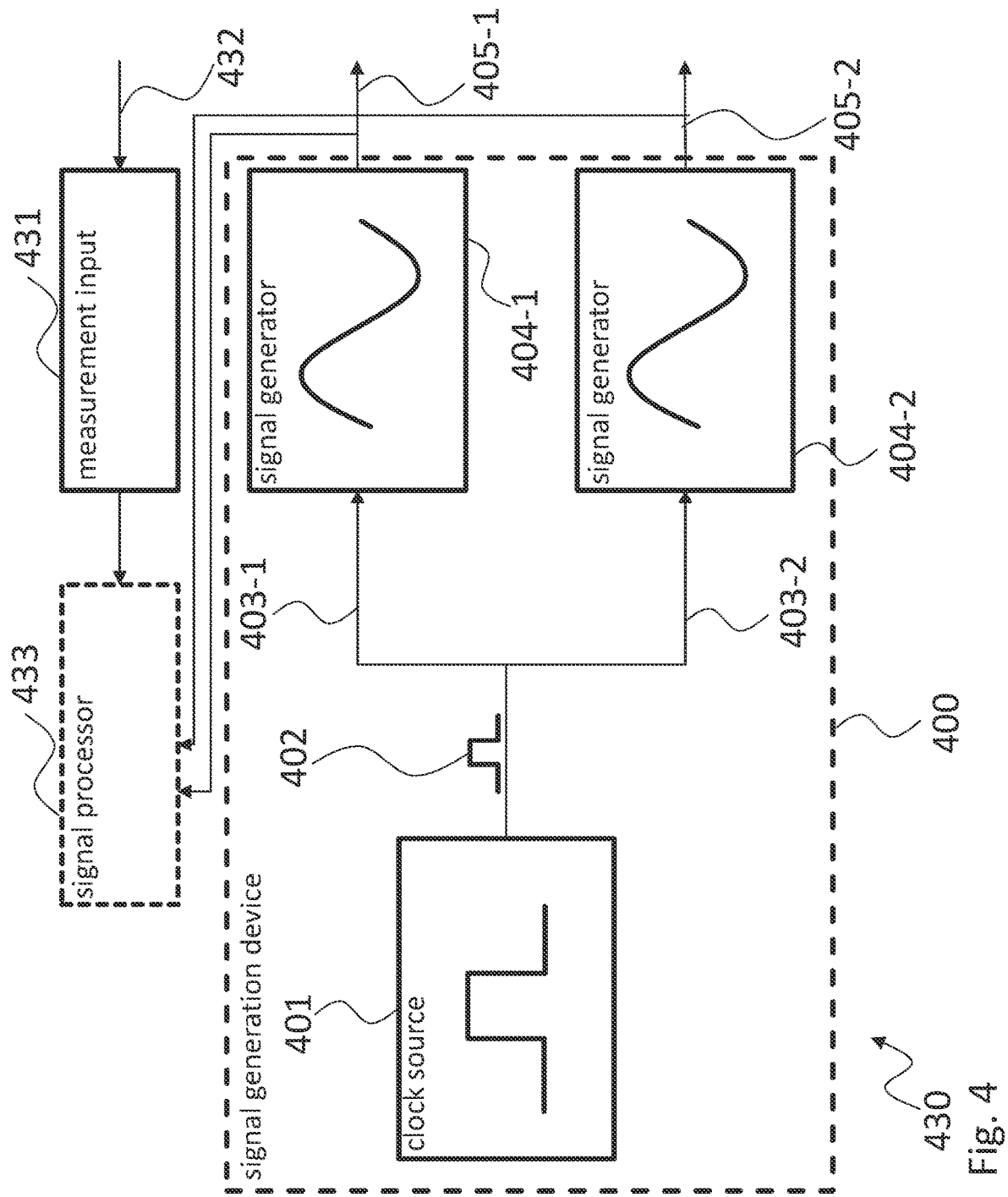
FIG. 4 shows a block diagram of an embodiment of a measurement device according to the present disclosure.

FIG. 4 shows a block diagram of an embodiment of a measurement device 430. The measurement device 430 exemplarily comprises a signal generation device as shown in FIG. 1. It is understood, that the measurement device 430 may be provided with a signal generation device according to any of the embodiments provided in this disclosure.

The measurement device 430 further comprises a measurement input 431 that may be coupled to an optional signal processor 433. Although only one measurement input 431 is shown, it is understood, that the measurement device 430 may comprise more than one measurement input 431 to measure multiple signals.

The measurement device 430 may provide the output signals 405-1, 405-2 as differential signals to a DUT. The measurement input 431 may then receive a signal 432 as provided from the DUT after receiving the output signals 405-1, 405-2. In embodiments, the measurement device 430 may comprise a display and display the signal 432.

The optional signal processor 433 may be used to evaluate the signal 432, especially with regard to the output signals 405-1, 405-2. The signal processor 433 may for example, determine a frequency response of the DUT. Such a frequency response may for example be shown to a user as a Bode plot on a display of the measurement device 430.

Figure 5:
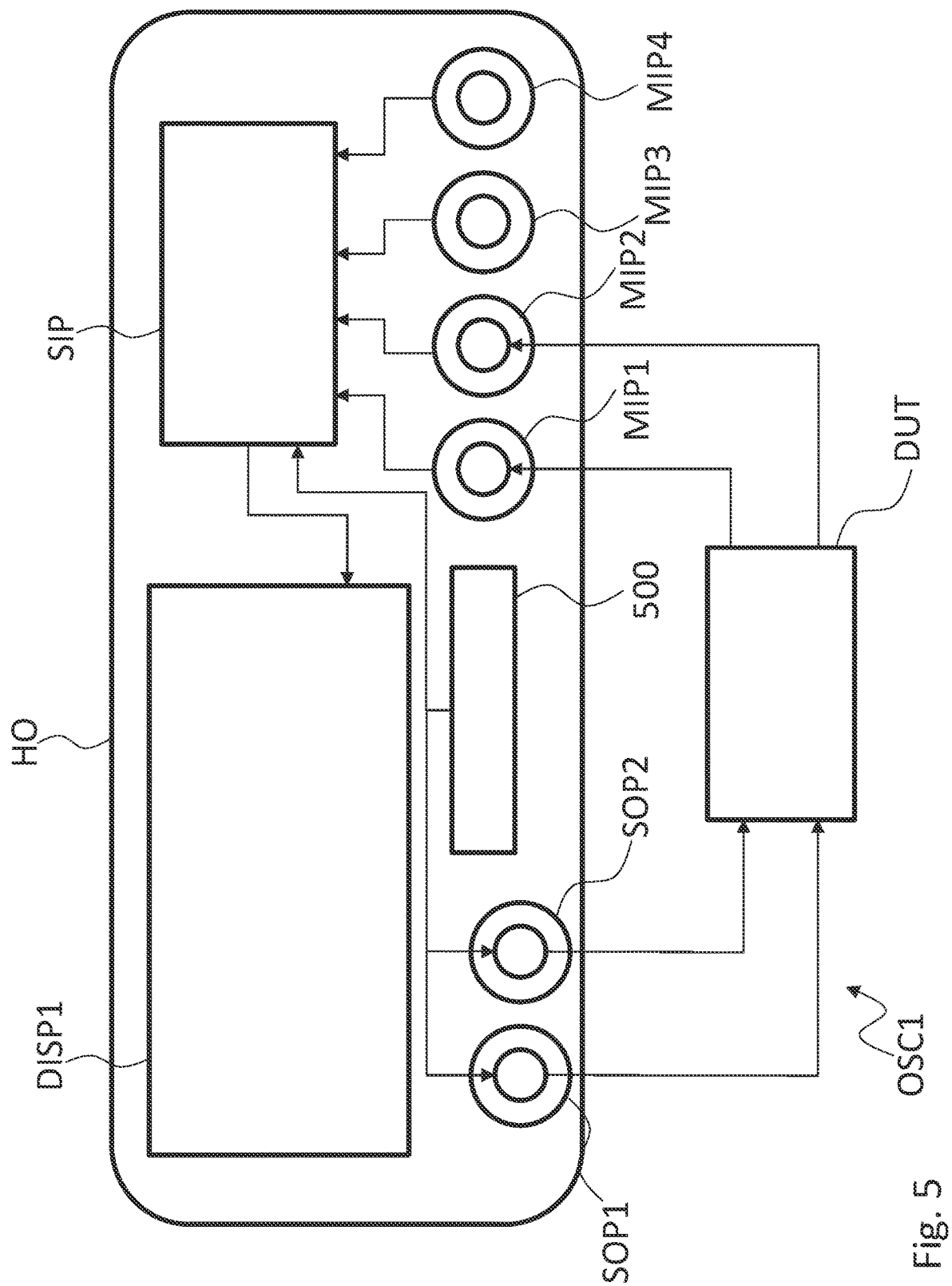
FIG. 5 shows a block diagram of an embodiment of an oscilloscope as measurement device according to the present disclosure.

FIG. 5 shows a block diagram of an oscilloscope OSC1 that may be used as a measurement device according to the present disclosure.

The oscilloscope OSC1 comprises a housing HO that accommodates four measurement inputs MIP1, MIP2, MIP3, MIP4 that are coupled to a signal processor SIP for processing any measured signals. The signal processor SIP is coupled to a display DISP1 for displaying the measured signals to a user.

The oscilloscope OSC1 further comprises a signal generation device 500. It is understood, that the signal generation device 500 may be a signal generation device according to any of the embodiments presented in this disclosure.

In the oscilloscope OSC1, the signal generation device 500 may provide two output signals to a DUT, especially two differential output signals. These signals may also be provided to the signal processor SIP.

The exemplary DUT in FIG. 5 outputs a differential output signal. The two signals of this differential signal are measured with the measurement inputs MIP1, MIP2 of the oscilloscope OSC1. The signal processor SIP may then use the signals from the signal generation device 500 and the measured signals from the DUT to determine the frequency response of the DUT and display the frequency response for example, as Bode diagram, on the display DISP1.

Figure 6:
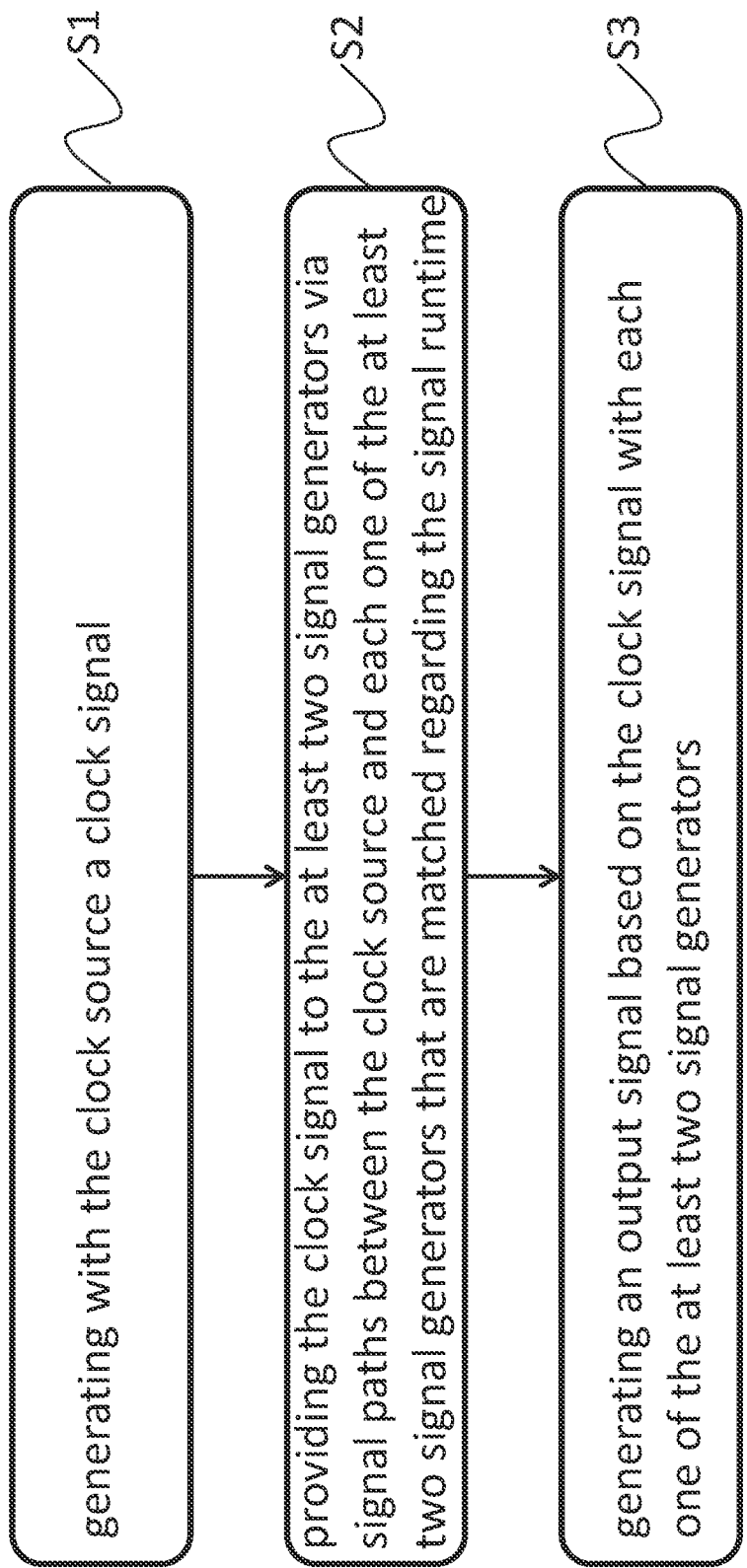
FIG. 6 shows a flow diagram of an embodiment of a method according to the present invention.

FIG. 6 shows a flow diagram of a method for operating a signal generation device that comprises at least two signal generators, and a clock source that is coupled to the at least two signal generators.

The method comprises generating S1 with the clock source a clock signal, providing S2 the clock signal to the at least two signal generators via signal paths between the clock source and each one of the at least two signal generators that are matched at least regarding the signal runtime, and generating S3 an output signal based on the clock signal with each one of the at least two signal generators.

The method may further comprise measuring the output signal of each one of the at least two signal generators, comparing the amplitudes of the measured output signals, and providing a respective amplitude correction factor for at least each one of the measured output signals but one of the measured output signals, wherein the amplitudes of the output signals are controlled based on the respective amplitude correction factor for each one of the output signals for which an amplitude correction factor is provided.

In order to further synchronize the output signals, the method may further comprise measuring the output signal of each one of the at least two signal generators, comparing the phases of the measured output signals, and providing a respective phase correction factor for at least each one of the measured output signals but one of the measured output signals, wherein the phases of the output signals are controlled based on the phase correction factor for each one of the output signals for which a phase correction factor is provided.

The output signals may for example be generated with at least two signal generators that each comprise an arbitrary signal generator with a signal memory, wherein the arbitrary signal generator outputs an arbitrary signal based on signal data that is stored in the signal memory. In embodiments, the at least two signal generators may each comprise a sine signal generator that is configured to output a sine signal with a predetermined frequency and amplitude.

In order to adapt the amplitudes and phases of the output signals, the at least two signal generators may each comprise at least one of an attenuation/amplification unit, and a phase shifter in at least one of the digital domain and the analog domain.

The output signals may in embodiments be generated with an oscilloscope or a frequency response analysis device that comprises the respective signal generators.

After calibrating or synchronizing the signal generators, the method may further comprise measuring at least one signal provided by a device under test based on the output signals provided to the device under test.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

LIST OF REFERENCE SIGNS

| | |
|---|---|
| 100, 200, 300, 400, 500 | signal generation device |
| 101, 201, 301, 401 | clock source |
| 102, 202, 302, 402 | clock signal |
| 103-1, 103-2, 203-1, 203-2 | signal path |
| 303-1, 303-2, 403-1, 403-2 | signal path |
| 104-1, 104-2, 204-1, 204-2 | signal generator |
| 304-1, 304-2, 404-1, 404-2 | signal generator |
| 105-1, 105-2, 205-1, 205-2 | output signal |
| 305-1, 305-2, 405-1, 405-2 | output signal |
| 210-1, 210-2, 310-1, 310-2 | signal measurement sensor |
| 211, 311 | signal comparator |
| 212-1, 212-2, 312-1, 312-2 | correction factor |
| 319-1, 319-2 | digital signal generation section |
| 320-1, 320-2 | memory |
| 321-1, 321-2 | attenuation/amplification unit |
| 322-1, 322-2 | phase shifter |
| 323-1, 323-2 | digital-to-analog converter |
| 430 | measurement device |
| 431 | measurement input |
| 432 | signal |
| 433 | signal processor |
| OSC1 | oscilloscope |
| HO | housing |
| MIP1, MIP2, MIP3, MIP4 | measurement input |
| SIP | signal processing |
| DISP1 | display |
| SOP1, SOP2 | signal output |
| DUT | device under test |

The invention claimed is:

1. A signal generation device, comprising:
at least two signal generators; and
a clock source that is coupled to the at least two signal generators and that is configured to generate a clock signal and provide the clock signal to the at least two signal generators;
wherein the signal paths between the clock source and each one of the at least two signal generators are matched at least regarding the signal runtime; and
wherein the at least two signal generators are each configured to generate an output signal based on the clock signal,
wherein the signal generation device comprises:
a first signal measurement sensor for each one of the at least two signal generators, and
a first signal comparator that is coupled on the input side to each one of the first signal measurement sensors and on the output side to at least all of the at least two signal generators but one of the at least two signal generators,
wherein each one of the first signal measurement sensors is configured to measure the output signal of the respective one of the at least two signal generators,
wherein the first signal comparator is configured to compare the amplitudes of the output signals and provide a respective amplitude correction factor to each one of the at least two signal generators to which the first signal comparator is coupled to,
wherein each one of the at least two signal generators to which the first signal comparator is coupled to comprises an amplitude controller configured to control the amplitude of the respective output signal based on the amplitude correction factor; or
the signal generation device comprises:
a second signal measurement sensor for each one of the at least two signal generators, and
a second signal comparator that is coupled on the input side to each one of the second signal measurement sensors and on the output side to at least all of the at least two signal generators but one of the at least two signal generators,
wherein each one of the second signal measurement sensors is configured to measure the output signal of the respective one of the at least two signal generators,
wherein the second signal comparator is configured to compare the phases of the output signals and provide a respective phase correction factor to each one of the at least two signal generators to which the second signal comparator is coupled to,
wherein each one of the at least two signal generators to which the second signal comparator is coupled to comprises a phase controller configured to control the phase of the respective output signal based on the phase correction factor.

2. The signal generation device according to claim 1, wherein the at least two signal generators each comprises an arbitrary signal generator with a signal memory, wherein the arbitrary signal generator is configured to output an arbitrary signal based on signal data that is stored in the signal memory.

3. The signal generation device according to claim 1, wherein the at least two signal generators each comprises a sine signal generator that is configured to output a sine signal with a predetermined frequency and amplitude.

4. The signal generation device according to claim 1, wherein the at least two signal generators each comprises at least one of an attenuation/amplification unit or a phase shifter.

5. The signal generation device according to claim 1, wherein the at least two signal generators each comprises a digital signal generation section and a digital-to-analog converter coupled to the digital signal generation section.

6. The signal generation device according to claim 1, wherein the signal generation device is provided as an oscilloscope or as a frequency response analysis device.

7. The signal generation device according to claim 1, wherein the at least two signal generators are configured to each output the respective output signal with at least one of a configurable phase offset, a configurable amplitude, or a configurable amplitude offset.

8. A measurement device, comprising:
a signal generation device, the signal generation device comprising:
at least two signal generators,
a clock source that is coupled to the at least two signal generators and that is configured to generate a clock signal and provide the clock signal to the at least two signal generators,
wherein the signal paths between the clock source and each one of the at least two signal generators are matched at least regarding the signal runtime, and wherein the at least two signal generators are each configured to generate an output signal for a device under test based on the clock signal; and at least one signal measurement input configured to measure a signal generated by the device under test based on the output signals provided to the device under test wherein the signal generation device comprises:

a first signal measurement sensor for each one of the at least two signal generators, and a first signal comparator that is coupled on the input side to each one of the first signal measurement sensors and on the output side to at least all of the at least two signal generators but one of the at least two signal generators, wherein each one of the first signal measurement sensors is configured to measure the output signal of the respective one of the at least two signal generators, wherein the first signal comparator is configured to compare the amplitudes of the output signals and provide a respective amplitude correction factor to each one of the at least two signal generators to which the first signal comparator is coupled to, wherein each one of the at least two signal generators to which the first signal comparator is coupled to comprises an amplitude controller configured to control the amplitude of the respective output signal based on the amplitude correction factor; or wherein the signal generation device comprises:

a second signal measurement sensor for each one of the at least two signal generators, and a second signal comparator that is coupled on the input side to each one of the second signal measurement sensors and on the output side to at least all of the at least two signal generators but one of the at least two signal generators, wherein each one of the second signal measurement sensors is configured to measure the output signal of the respective one of the at least two signal generators, wherein the second signal comparator is configured to compare the phases of the output signals and provide a respective phase correction factor to each one of the at least two signal generators to which the second signal comparator is coupled to, wherein each one of the at least two signal generators to which the second signal comparator is coupled to comprises a phase controller configured to control the phase of the respective output signal based on the phase correction factor.

9. The measurement device according to claim 8, wherein the at least two signal generators are configured to output a differential signal to a device under test.

10. The measurement device according to claim 8, comprising a signal processor configured to calculate a frequency response for the device under test based on the output signals and the signal measured by the at least one signal measurement input.

11. A method for operating a signal generation device, wherein the signal generation device comprises at least two signal generators, and a clock source that is coupled to the at least two signal generators, the method comprising:

generating with the clock source a clock signal;

providing the clock signal to the at least two signal generators via signal paths between the clock source and each one of the at least two signal generators that are matched at least regarding the signal runtime; and generating an output signal based on the clock signal with each one of the at least two signal generators, wherein the method further comprises:

measuring the output signal of each one of the at least two signal generators, comparing the amplitudes of the measured output signals, and providing a respective amplitude correction factor for at least each one of the measured output signals but one of the measured output signals, wherein the amplitudes of the output signals are controlled based on the respective amplitude correction factor for each one of the output signals for which an amplitude correction factor is provided; or wherein the method further comprises:

measuring the output signal of each one of the at least two signal generators, comparing the phases of the measured output signals, and providing a respective phase correction factor for all but one of the measured output signals, wherein the phases of the output signals are controlled based on the phase correction factor for each one of the output signals for which a phase correction factor is provided.

12. The method according to claim 11, wherein the output signals are generated with at least two signal generators that each comprises an arbitrary signal generator with a signal memory, wherein the arbitrary signal generator outputs an arbitrary signal based on signal data that is stored in the signal memory.

13. The method according to claim 11, wherein the output signals are generated with at least two signal generators that each comprises a sine signal generator that is configured to output a sine signal with a predetermined frequency and amplitude.

14. The method according to claim 11, wherein the output signals are generated with at least two signal generators that each comprises at least one of an attenuation/amplification unit or a phase shifter.

15. The method according to claim 11, wherein the output signals are generated with an oscilloscope or a frequency response analysis device.

16. The method according to claim 15, further comprising measuring at least one signal provided by a device under test based on the output signals provided to the device under test.

* * * * *